United States Patent
Marinelli et al.

(10) Patent No.: US 7,279,893 B1
(45) Date of Patent: Oct. 9, 2007

(54) RECEIVER CHANNEL DATA COMBINING IN PARALLEL MR IMAGING

(75) Inventors: Luca Marinelli, Schenectady, NY (US); Christopher Judson Hardy, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/426,728

(22) Filed: Jun. 27, 2006

Related U.S. Application Data

(60) Provisional application No. 60/745,196, filed on Apr. 20, 2006.

(51) Int. Cl.
   *G01V 3/00* (2006.01)
(52) U.S. Cl. .................................................. 324/307
(58) Field of Classification Search ........ 324/300–322; 600/410–435; 702/106, 182–183, 189; 343/725–728, 343/741–744, 824–831, 866–876, 893, 904–916
See application file for complete search history.

(56) References Cited

U.S. PATENT DOCUMENTS

| | | | | | |
|---|---|---|---|---|---|
| 4,825,162 | A * | 4/1989 | Roemer et al. | ............. | 324/318 |
| 4,947,121 | A * | 8/1990 | Hayes | ......................... | 324/322 |
| 5,910,728 | A * | 6/1999 | Sodickson | ................... | 324/309 |
| 6,534,983 | B1 * | 3/2003 | Boskamp et al. | ............ | 324/318 |
| 6,865,494 | B2 * | 3/2005 | Duensing et al. | ............. | 702/38 |
| 6,980,001 | B2 * | 12/2005 | Paley et al. | ................. | 324/318 |
| 7,057,387 | B2 * | 6/2006 | Duensing et al. | ........... | 324/307 |
| 7,109,710 | B2 * | 9/2006 | Chu et al. | .................... | 324/309 |
| 7,141,971 | B2 * | 11/2006 | Duensing et al. | ........... | 324/307 |
| 2006/0208731 | A1 * | 9/2006 | Wang et al. | ................. | 324/309 |
| 2006/0273792 | A1 * | 12/2006 | Kholmovski et al. | ....... | 324/309 |
| 2007/0036202 | A1 * | 2/2007 | Ge et al. | ..................... | 375/141 |

OTHER PUBLICATIONS

M. Buehrer et al., Automatic Coil Element Selection for Parallel Imaging of Localized Regions, Proc. Intl. Soc. Mag. Reson. Med. 14 (2006), pp. 294.
S.B. King et al., The MRI Eigencoil: 2N-Channel SNR with N-Receivers, Proc. Intl. Soc. Mag. Reson. Med. 11 (2003), pp. 712.
Scott B. King et al., Eigenmode Analysis for Understanding Phased Array Coils and Their Limits, Concepts in Magnetic Resonance Part B (Magnetic Resonance Engineering), pp. 42-49.
D. K. Sodickson et al., A generalized approach to parallel magnetic resonance imaging. Med. Phys. 28 (8), 1629-1643 (2001).
K.P. Pruessmann et al., SENSE: Sensitivity Encoding for Fast MRI. Magn. Res. Med. 42:952-962 (1999).
P.B. Roemer et al., The NMR Phased Array, Magnetic Resonance in Medicine 16, 192-225 (1990).

* cited by examiner

*Primary Examiner*—Diego Gutierrez
*Assistant Examiner*—Dixomara Vargas
(74) *Attorney, Agent, or Firm*—Jean K. Testa; Curtis B. Brueske

(57) ABSTRACT

An image reconstruction technique determines linear combinations of receiver channel information that contribute the most to image SNR and quantifies the SNR loss for the reduced receiver channel set for image reconstruction to reduce the computational burden placed on the reconstruction engine of an MRI system.

23 Claims, 2 Drawing Sheets

RECEIVER CHANNEL DATA COMBINING IN PARALLEL MR IMAGING

CROSS-REFERENCE TO RELATED APPLICATION

This application claims the benefit of U.S. Ser. No. 60/745,196, filed Apr. 20, 2006, the disclosure of which is incorporated herein by reference.

GOVERNMENT LICENSE RIGHTS

The U.S. Government has a paid-up license in this invention and the right in limited circumstances to require the patent owner to license others on reasonable terms as provided for by the terms of Government Contract No. 1 R01 RR15396-01 awarded by National Institutes of Health.

BACKGROUND OF THE INVENTION

The present invention is directed to magnetic resonance (MR) imaging and, more particularly, to a method and computerized system for increasing the speed of MR image reconstruction in a multi-coil MR data acquisition in a less computationally burdensome manner.

The number of receiver channels of MR systems is steadily increasing to meet the demands of parallel MR imaging techniques. Parallel imaging encompasses a category of imaging techniques often used in MR studies to accelerate data acquisition. This is achieved by sampling an imaging volume with an array of RF receive coils or channels in parallel. As each coil acquires MR signal from each volume element (voxel) of the imaging volume, the sensitivity of each coil to the imaging volume may be exploited to reduce the number of phase encoding steps that are necessary to completely sample the imaging volume field of view (FOV). By reducing the number of phase encoding steps, data acquisition can either be accelerated or, alternatively, more phase encoding steps may be used without increasing scan time to improve resolution.

To decrease scan time or increase resolution, MR scanners are being equipped with more channels. In addition to achieving higher acceleration factors, increasing the number of receive channels also allows for more flexibility in the choice of FOV and/or scan planes. Nonetheless, this redundancy results in an excessive data flow which can burden the reconstruction engine and slow down acquisition without significant benefits as quantified by image signal-to-noise (SNR) ratio.

It would therefore be desirable to have an image reconstruction technique that exploits the benefits of multi-coil, i.e., parallel, acquisition without overburdening the reconstruction engine of an MR scanner.

BRIEF DESCRIPTION OF THE INVENTION

The invention is directed to a reconstruction technique that overcomes the aforementioned drawbacks, by, in one embodiment, selecting only linear combinations of receiver channel information that contribute the most to image SNR and quantifying the SNR loss for the reduced receiver channel set.

Therefore, in one aspect, the invention includes an MRI apparatus that includes a magnetic resonance imaging (MRI) system having a plurality of gradient coils positioned about a bore of a magnet to impress a polarizing magnetic field and an RF transceiver system and an RF switch controlled by a pulse module to transmit RF signals to an array of RF receive coils to acquire MR images. The MRI apparatus further has a computer programmed to receive multiple channels of MR data sampled from an imaging volume with the array of RF receive coils and generate a noise correlation matrix from the MR data. The computer is further programmed to determine a set of combinations of the multiple channels of MR data for image reconstruction of a group of volume elements (voxels) in the imaging volume from the noise correlation matrix. The noise correlation matrix can be computed using signals acquired simultaneously from all RF coils when no excitation RF pulse has been applied to the imaging volume. A subset of such combinations or virtual coils can then be employed for image reconstruction, thus unburdening the reconstruction engine.

In another aspect, a computer readable storage medium is provided as having a computer program stored thereon and representing a set of instructions that when executed by a computer causes the computer to sample an imaging volume with an array of RF receive coils and determine an SNR value of each RF receive coil at a given voxel. The instructions further cause the computer to use MR data for reconstruction of the given voxel from a chosen subset of RF receive coils to minimize SNR loss in a region of interest (ROI). One possible strategy for selecting which RF receive coils to use in image reconstruction is to use those coils that exceed a given SNR threshold. Alternatively, coils can be sorted by their sensitivity at a given voxel and the subset with largest coil sensitivity can be used for image reconstruction.

According to another aspect, a method of MR imaging includes sampling the imaging volume with an RF coil array and generating a noise correlation matrix from MR data. Using the noise correlation matrix, coil combinations can be computed that diagonalize the noise correlation matrix. The method further includes ranking the sensitivity of each virtual coil for each voxel in the region of interest, and discriminately selecting which virtual coils whose MR data is to be included for image reconstruction of the given voxel, based on the ranking of the sensitivities.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
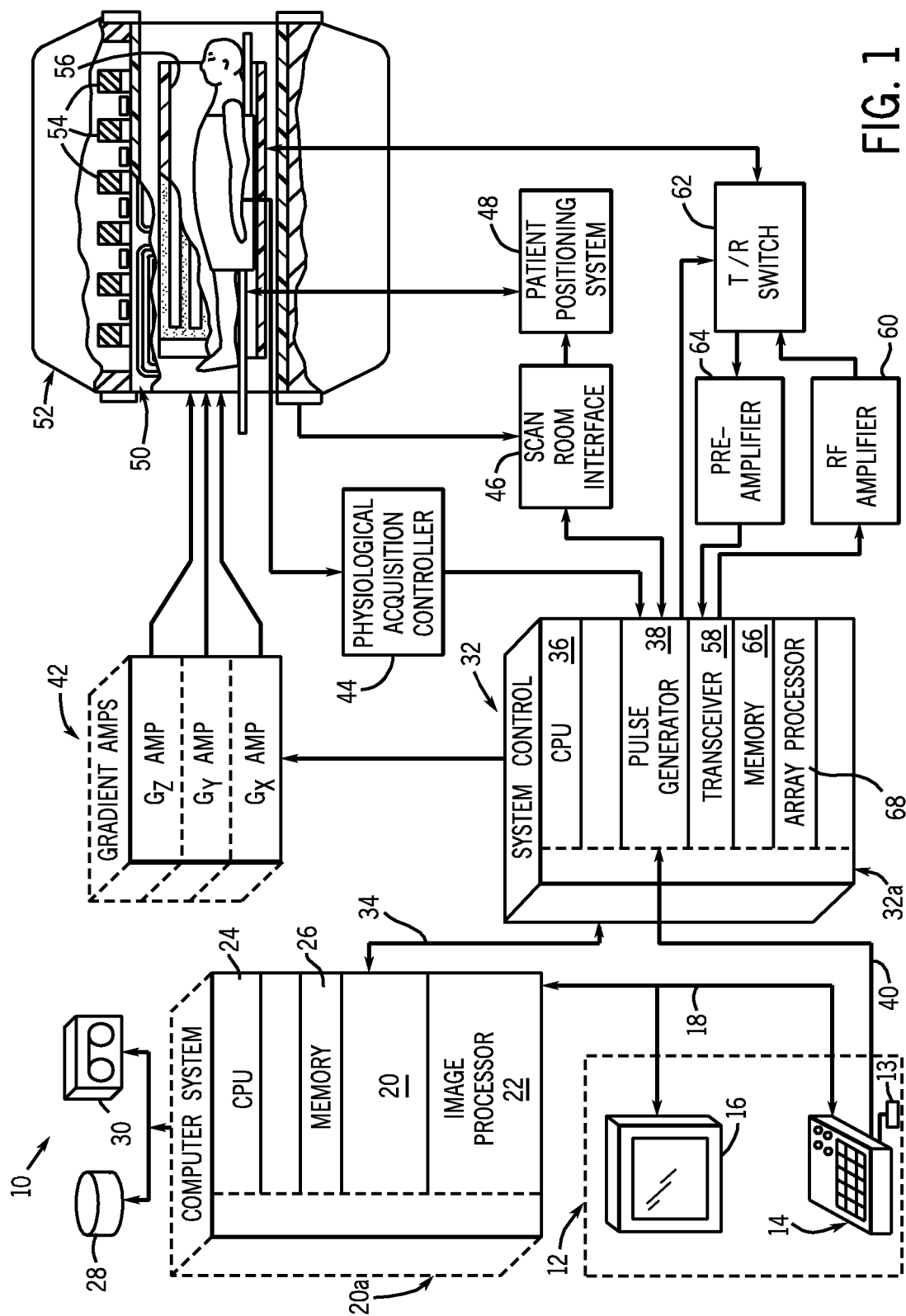
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and computer storage 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode. One skilled in the art will appreciate that the MRI system may be fit with a multi-coil array for parallel imaging and other multi-coil studies.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the computer storage 30 or other computer-readable memory, or it may be further processed by the image processor 22 and conveyed to the operator console 12 and presented on the display 16.

The invention is directed to an image reconstruction technique that may be executed by the computer system in the MRI system described with respect to FIG. 1, or equivalents thereto. It is also understood that the reconstruction technique may be carried out on a stand-alone computerized system that is networked or otherwise configured to access MR data acquired by an MRI system. In this regard, it is contemplated that the image reconstruction technique can be used to reconstruct images remotely from the MRI scanner used to acquire the MR data. As will be explained in greater detail below, the invention includes a computer-implementable process that selects the effective receiver channels that contribute maximally to image SNR at a given voxel location by taking suitable combinations of physical receiver channel data. As will also be explained, the invention can be implemented with unaccelerated as well as accelerated parallel imaging.

Given a phased array of M coils for parallel imaging, it is known that the optimal SNR for such a coil arrangement can be expressed as:

$$SNR(\vec{r})^2 \approx \sum_{jk} C_j(\vec{r}) * \psi_{jk}^{-1} C_k(\vec{r}) \qquad [\text{Eqn. 1}]$$

$$\Psi_{jk} = n_j^*(t) n_k(t) \qquad [\text{Eqn. 2}]$$

where $C_j(r)$ is the j-th coil sensitivity function and $\Psi_{jk}$ is the M×M noise correlation matrix. To reduce the number of effective channels while retaining SNR, the linear combination of receiver channel information is determined from the eigenvectors of the noise correlation matrix:

$$D_j(\vec{r}) = \sum_k R_{jk}^H C_k(\vec{r}) \qquad [\text{Eqn. 3}]$$

where the $R_{jk}$ is the matrix of eigenvectors of $\Psi_{jk}$ and $$\eta = R^H \Psi R \text{ such that } \eta_{jk} = \sigma_j^2 \delta_{jk} \qquad [\text{Eqn. 4}]$$

$$R^H R = Id$$

Accordingly, the expression for the optimal SNR reduces to:

$$SNR(\vec{r})^2 \approx \sum_{jk} C_j(\vec{r}) * \psi_{jk}^{-1} C_k(\vec{r}) = \sum_k \sigma_k^{-2} |D_k(\vec{r})|^2 \qquad [\text{Eqn. 5}]$$

or equivalently, the virtual coils described by the sensitivity functions $D_k(r)$ are uncorrelated.

To reduce the computational requirements on the MRI scanner or other reconstruction engine, it is desired to reconstruct a given voxel with MR data from fewer than all of the receive channels that sampled that given voxel. In other words, the SNR loss will be minimized at each voxel location by sorting the set $\{\sigma_k^{-2}|D_k(\vec{r})|^2: k=1, \ldots, M\}$ in order of decreasing magnitude. By appropriately sorting the set of virtual coil SNR values at each voxel location, the N largest terms can be isolated and used for image reconstruction, wherein the MRI system has M receive channels and N is less than M.

For example, given an array of seven circular coils arranged in a hexagonal pattern with a nearest-neighbor distance of 1.52a (where a is the coil radius), to minimize the magnetic coupling between elements of the array, the noise correlation matrix can be calculated using the Biot-Savart law and by diagonalizing the matrix, the linear combinations that will reduce the number of channels of data to reconstruct a given voxel without a substantial loss in SNR can be found.

As referenced above, the invention is also applicable with accelerated imaging studies. In the case of SENSE accelerated imaging, the expression for image SNR no longer has a quadratic form, as shown below:

$$SNR(\vec{r}_k)^2 \approx \frac{1}{(S^H \psi^{-1} S)_{kk}^{-1}} = \frac{1}{(T^H \eta^{-1} T)_{kk}^{-1}} \quad [\text{Eqn. 5}]$$

$$(T^H \eta^{-1} T)_{lm} = \sum_k \sigma_k^{-2} D_k(\vec{r}_l) * D_k(\vec{r}_m) \quad [\text{Eqn. 6}]$$

In this case, S and T are each an R×M matrix where R is the acceleration factor and represents the coupling between aliased picture elements (pixels) through the sensitivity of the coils. Given a voxel location $r_k$, the R-1 voxels that alias onto $r_k$ are considered and the set of contributions to unaccelerated SNR at all such aliased voxels are sorted. If N modes are kept at each location, then a maximum of R×N modes will be considered in the parallel reconstruction, e.g., Sensitivity Encoding (SENSE). It is recognized that there may be some overlap in the most relevant modes at different pixel locations and so the total number of modes may be fewer than R×N. Therefore, the invention achieves significant improvement in reconstruction speed compared to the full parallel acquisitions, such as SENSE, without a significant SNR loss.

In one alternate embodiment, a basis set other than eigenvectors of the noise correlation matrix is used for coil combination. For example, for parallel imaging, a basis set that is less complex to calculate could be chosen which maximizes an approximate form of the SNR expression.

In another alternate embodiment, the present invention can be applied to parallel imaging techniques such as the generalized encoding matrix method (GEM). In a k-space implementation of GEM, the effective channels which most closely approximate the needed harmonic functions can be used, and the others excluded. It is also contemplated that the invention is equivalently applicable with hybrid space implementations, where coil weightings are calculated in k-space and applied in image space.

Figure 2:
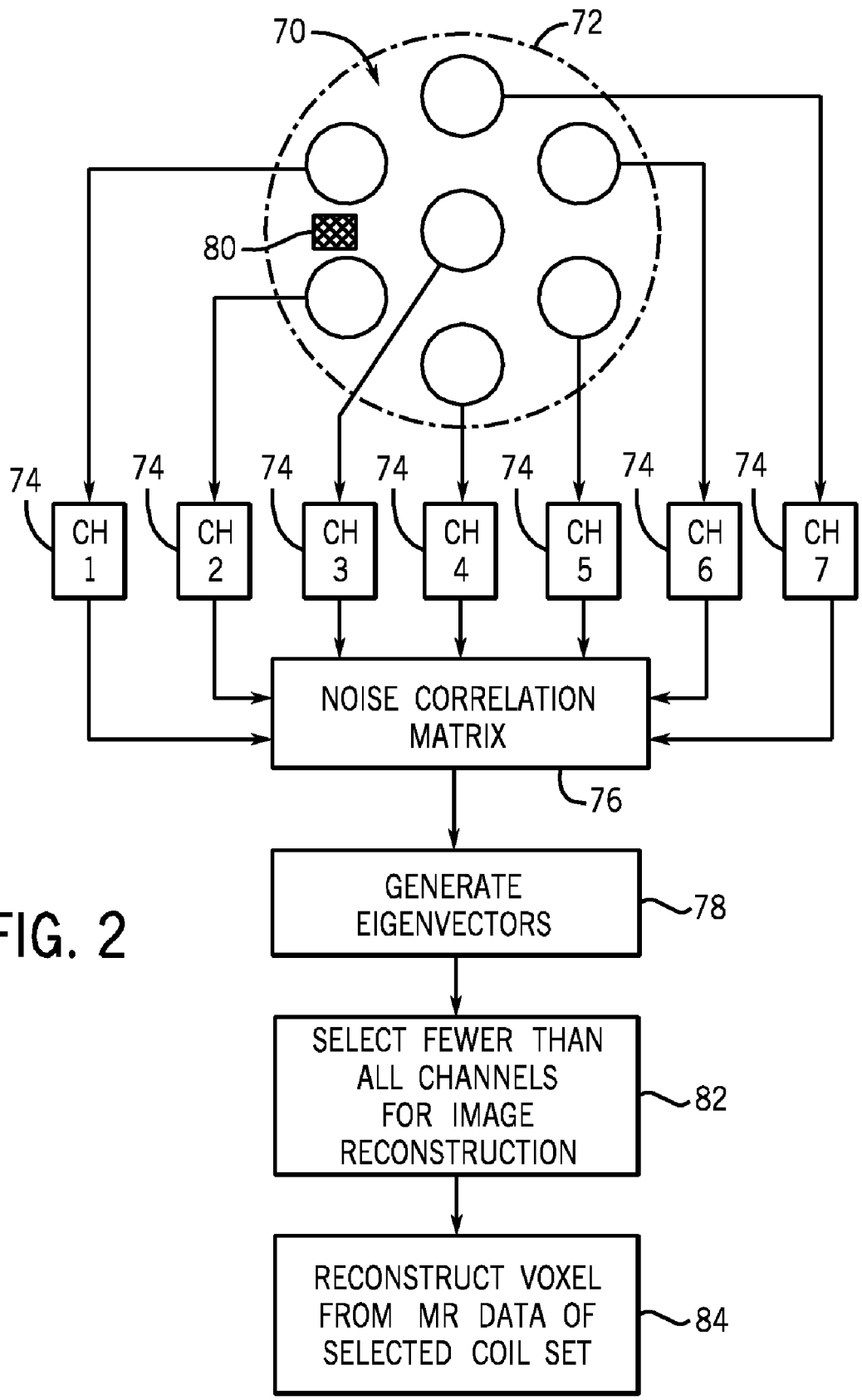
FIG. 2 is a process map executable with the MR imaging system of FIG. 1 according to one aspect of the present invention.

Referring now to FIG. 2, a process map for executing the mathematical operations described above is shown according to one aspect of the present invention. As illustrated thereat, an array of RF coils 70 is used to sample an imaging volume 72. Each coil 70 of the array samples the imaging volume and provides an output that is fed to a respective data channel 74. In the illustrated embodiment, the coil array includes seven coils and thus, seven data channels; however, it is contemplated that the coil array may have fewer or more than seven coil or coil elements. The data channels are connected to a processor (not shown) that carries out one or more computer programs for image reconstruction, including that described herein. In this regard, the processor receives the MR data from the several data channels 74 and generates a noise correlation matrix 76.

As described above, the processor calculates eigenvectors 78 from the noise correlation matrix. The eigenvectors, as described herein, provide a sorting value that is used to rank the SNR sensitivity of each virtual coil to a given voxel 80 of the imaging volume 72 that is to be reconstructed. The SNR sensitivity values allow the processor to discriminately select those virtual coils whose MR data will be used for reconstructing the given voxel. In this regard, the processor ranks the virtual coils of the coil array 82, and those virtual coil having an SNR sensitivity value exceeding a given threshold, will have their MR data used for image reconstruction 84.

It is contemplated that the SNR sensitivity threshold can be predetermined or determined on-the-fly. As such, the invention contemplates that data from fewer than all the virtual coils of the coil array will always be used for image reconstruction of the given voxel as the MR data from the virtual coils with the least SNR sensitivity value to the given voxel will be excluded from image reconstruction.

Therefore, in one embodiment, the invention includes an MRI apparatus that includes a magnetic resonance imaging (MRI) system having a plurality of gradient coils positioned about a bore of a magnet to impress a polarizing magnetic field and an RF transceiver system and an RF switch controlled by a pulse module to transmit RF signals to an array of RF receive coils to acquire MR images. The MRI apparatus further has a computer programmed to receive multiple channels of MR data sampled from an imaging volume with the array of RF receive coils and generate a noise correlation matrix from the MR data. The computer is further programmed to determine a combination of the multiple channels of MR data for image reconstruction of the given voxel from the noise correlation matrix. Fewer than all virtual coils obtained by combinations of the acquired multiple channels of MR data are used for image reconstruction.

In another embodiment, a computer readable storage medium is provided as having a computer program stored thereon and representing a set of instructions that when executed by a computer causes the computer to sample an imaging volume with an array of RF receive coils and determine an SNR value of each RF receive coil to a given voxel. The computer is further caused to use MR data for reconstruction of the given voxel from those RF receive coils having an SNR value exceeding a given SNR threshold.

According to another embodiment, a method of MR imaging includes sampling a group of voxels with an RF coil array and generating a noise correlation matrix from MR data. The method further includes ranking the sensitivity of each virtual coil obtained by combining the signal from the RF coil with weightings given by the eigenvectors of the noise correlation matrix and discriminately selecting which virtual coil whose MR data is to be included for image reconstruction of the given voxel, based on the ranking of the sensitivities.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
a magnetic resonance imaging (MRI) system having a plurality of gradient coils positioned about a bore of a magnet to impress spatially dependent changes to a polarizing magnetic field and an RF transceiver system and an RF switch controlled by a pulse module to collect RF signals from an array of RF receive coils to acquire MR images, and a computer programmed to:
receive multiple channels of MR data from an imaging volume using the array of RF receive coils;
for a given volume element in the imaging volume, generate a noise correlation matrix from the MR data; and
determine a combination of the multiple channels of MR data for image reconstruction of the given voxel from the noise correlation matrix, wherein the combination is comprised of MR data from fewer than all the multiple channels of MR data.

2. The MRI apparatus of claim 1 wherein the computer programmed to rank the values by at least one of an SNR value and by level of sensitivity.

3. The MRI apparatus of claim 1 wherein the computer is further programmed to determine a linear combination of the MR data by at least one of diagonalizing the noise correlation matrix and by calculating the eigenvectors of the noise correlation matrix and rank the linear combination of MR data.

4. The MRI apparatus of claim 3 wherein the computer is further programmed to:
determine an SNR value of each RF receive coil to the given volume voxel;
rank the respective SNR values; and
use MR data for image reconstruction of the given voxel from only those RF receive coils having an SNR value exceeding a given threshold.

5. The MRI apparatus of claim 1 wherein the computer is further programmed to implement a parallel reconstruction within the imaging volume.

6. The MRI apparatus of claim 5 wherein the computer is further programmed to implement at least one of a SENSE and SMASH acquisition to reconstruct the imaging volume.

7. The MRI apparatus of claim 5 further comprising at least one of a GEM implementation and a k-space implementation of GEM.

8. The MRI apparatus of claim 7 wherein the computer is further programmed to determine the linear combination of the MR data with the effective channels which most closely approximate the needed harmonic functions.

9. The computer readable storage medium of claim 8 wherein the computer is further programmed to rank the values by at least one of an SNR value and by level of sensitivity.

10. The computer readable storage medium of claim 8 wherein the computer is further programmed to:
rank the respective SNR values;
identify one or more RF receive coils having an SNR value below the given threshold; and
exclude the MR data from the one or more RF receive coils from image reconstruction of the given voxel.

11. The computer readable storage medium of claim 8 wherein the computer is further programmed to execute at least one of a SMASH and SENSE-based image reconstruction.

12. The computer readable storage medium of claim 8 wherein the computer is further programmed to execute at least one of a GEM implementation and a k-space implementation of GEM.

13. The MRI apparatus of claim 1 wherein the computer is further programmed to implement a hybrid space reconstruction of the imaging volume.

14. A computer readable storage medium having a computer program stored thereon and representing a set of instructions that when executed by a computer causes the computer to:
sample an imaging volume with an array of RF receive coils;
determine an SNR value of each RF receive coil to a given voxel; and
use MR data for reconstruction of the given voxel from those RF receive coils having an SNR value exceeding a given SNR threshold.

15. The computer readable storage medium of claim 14 wherein the computer is further programmed to generate a noise correlation matrix for the array of RF receive coils and determine the SNR value of the RF receive coils from eigenvectors of the noise correlation matrix.

16. The computer readable storage medium of claim 14 wherein the computer is further programmed to sample the imaging volume with the array of RF receive coils in parallel.

17. A method of MR imaging comprising the steps of:
sampling a voxel with an RF coil array;
generating a noise correlation matrix from MR data acquired from the voxel;
ranking a SNR sensitivity of each coil of the RF coil array to the voxel from the noise correlation matrix; and
discriminately selecting which coils whose MR data is to be included for image reconstruction of the given voxel based on the ranking of the SNR sensitivities.

18. The method of claim 17 wherein the given voxel is sampled with a reduced number of phase encoding steps than are necessary to completely sample the imaging FOV.

19. The method of claim 17 wherein the given voxel is sampled with acceleration in at least one phase encoding direction.

20. The method of claim 17 further comprising the step of determining eigenvectors for the noise correlation matrix.

21. The method of claim 17 further comprising the step of establishing an SNR sensitivity threshold and using the MR data from only those RF coils having a SNR sensitivity exceeding the SNR sensitivity threshold.

22. The method of claim 17 further comprising the step of reconstructing the given voxel from MR data acquired with fewer than all the coils of the RF coil array.

23. The method of claim 17 further comprising the step of implementing a parallel reconstruction within the imaging volume.

* * * * *